US00RE41826E

(19) United States
(12) Reissued Patent
Nishida et al.

(10) Patent Number: US RE41,826 E
(45) Date of Reissued Patent: Oct. 19, 2010

(54) SEMICONDUCTOR DEVICE

(75) Inventors: Hisashige Nishida, Yamatokoriyama (JP); Yoshiki Sota, Nara (JP); Hiroyuki Juso, Kashiba (JP)

(73) Assignee: Sharp Kabushiki Kaisha, Osaka (JP)

(21) Appl. No.: 11/808,572
(22) Filed: Jun. 11, 2007

Related U.S. Patent Documents

Reissue of:
(64) Patent No.: 6,979,905
Issued: Dec. 27, 2005
Appl. No.: 10/762,242
Filed: Jan. 23, 2004

(30) Foreign Application Priority Data

Jan. 29, 2003 (JP) ..... 2003-020971

(51) Int. Cl.
*H01L 23/48* (2006.01)

(52) U.S. Cl. ..... 257/777; 257/780; 257/781; 257/784

(58) Field of Classification Search ..... 257/685, 257/686, 723, E25.005, E25.006, E25.021, 257/E25.027, E23.085; 438/109, FOR. 368, 438/FOR. 426
See application file for complete search history.

(56) References Cited

U.S. PATENT DOCUMENTS

| | | | | |
|---|---|---|---|---|
| 5,172,212 | A | 12/1992 | Baba | |
| 5,789,816 | A | 8/1998 | Wu | |
| 6,057,598 | A | 5/2000 | Payne et al. | |
| 6,316,838 | B1 | 11/2001 | Ozawa et al. | |
| 6,403,895 | B1 | 6/2002 | Sota | |
| 6,407,456 | B1 | 6/2002 | Ball | |
| 6,476,500 | B2 | 11/2002 | Kimura | |
| 2001/0020735 | A1 | 9/2001 | Chikawa et al. | |
| 2002/0024146 | A1 * | 2/2002 | Furusawa | 257/777 |
| 2002/0140110 | A1 | 10/2002 | Takahashi et al. | |
| 2003/0006490 | A1 | 1/2003 | Kawaishi | |
| 2003/0222339 | A1 | 12/2003 | Hirai | |

FOREIGN PATENT DOCUMENTS

| | | |
|---|---|---|
| JP | 60-094755 | 5/1985 |
| JP | 06-029458 | 2/1994 |
| JP | 06-045498 | 2/1994 |
| JP | 2000-232180 | 8/2000 |
| JP | 76250/2002 | 3/2001 |
| JP | 2001-102515 | 4/2001 |
| JP | 2001-127246 | 5/2001 |
| JP | 2001-177050 | 6/2001 |
| JP | 76250/2002 | 3/2002 |
| JP | 2002-217354 | 8/2002 |
| JP | 2003-23135 | 1/2003 |
| JP | 562240 | 4/2005 |
| TW | 562240 | 11/2003 |
| TW | 562240 | 4/2005 |

OTHER PUBLICATIONS

European Search Report mailed Apr. 2, 2004 in corresponding EP Appln. No. 04001610.7.
Taiwanese Office Action mailed Aug. 16, 2005 (w/English translation thereof).
Office Action in Japanese Patent Application No. 2003–20971, dated Jun. 22, 2010.

* cited by examiner

*Primary Examiner*—Jasmine J Clark
(74) *Attorney, Agent, or Firm*—Nixon & Vanderhye, PC

(57) ABSTRACT

In a semiconductor device in which a semiconductor chip is stacked on a substrate, an interposer chip having wirings is provided under the semiconductor chip. A bonding pad of the semiconductor chip is electrically connected to a bonding terminal provided on the substrate via the interposer chip by wire bonding. The interposer chip prevents a semiconductor element formed in the semiconductor chip from deteriorating in terms of an electric property and from being physically damaged. Further, the wire bonding strength does not drop. Moreover, it is possible to form a fine wiring pitch for relaying a wire-bonding wire.

26 Claims, 9 Drawing Sheets

FIG. 9 (a) (Prior Art)
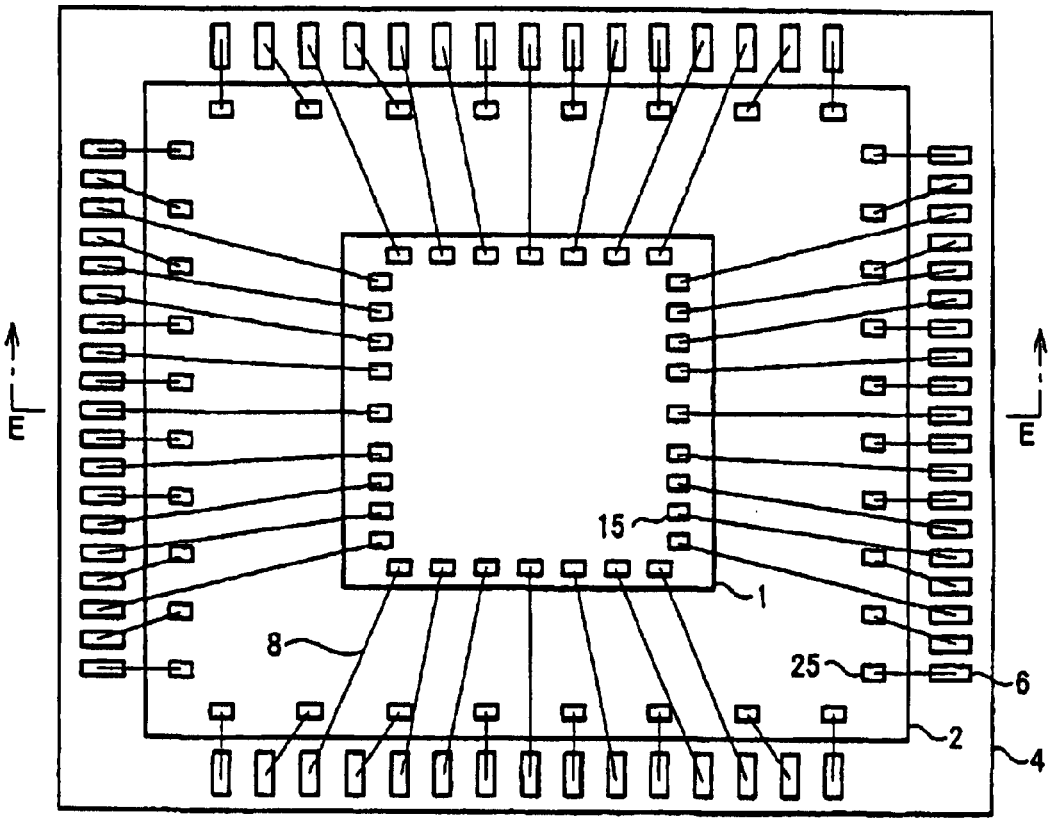
FIG. 9 (b) (Prior Art)
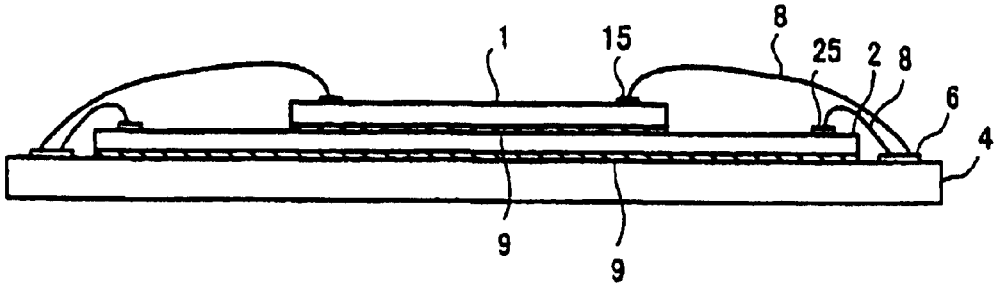

SEMICONDUCTOR DEVICE

Matter enclosed in heavy brackets [ ] appears in the original patent but forms no part of this reissue specification; matter printed in italics indicates the additions made by reissue.

This Nonprovisional application claims priority under 35 U.S.C. §119(a) on Patent Application No. 2003/020971 filed in Japan on Jan. 29, 2003, the entire contents of which are hereby incorporated by reference.

FIELD OF THE INVENTION

The present invention relates to a semiconductor device, particularly, to a semiconductor device in which a plurality of semiconductor chips are stacked.

BACKGROUND OF THE INVENTION

In order to realize high-density installation of semiconductor chips which is a key technology for making an electronic device smaller, lighter, and thinner, various packaging techniques of a semiconductor device have been developed.

As a technique concerning a packaging structure of a semiconductor device which reduces an area required in installing the semiconductor device onto a mother board, there have been developed: a pin-insert package such as DIP (Dual Inline Package); a surface installation package, such as SOP (Small Outline Package), performed by leading a periphery; a package such as BGA (Ball Grid Array) in which external output terminals are disposed on an under surface of the package in a lattice manner. Further, as a technique for realizing high-density installation by reducing an area ratio of a package with respect to semiconductor chips, various efforts have been made so as to narrow a pitch of the external output terminals and reduce a package size by making substrate wirings finer.

Further, as a multi-chip package in which a plurality of semiconductor chips are gathered so as to be installed into a single package, there has been developed a technique such as a chip-stacked package in which a plurality of semiconductor chips are stacked so as to realize higher-density installation. Further, as the multi-chip package, there has been developed a system-in package in which a plurality of semiconductor chips respectively having functions different from each other are sealed and systemized in a single package.

While, as a method for making an electronic device smaller, lighter, and thinner, a method different from high-density packaging and installation of the semiconductor chips attracts attention. This method uses such a system-on chip that: circuits such as a memory circuit, a logic circuit, and an analog circuit that have been conventionally provided separately from each other are provided in combination and are integrated in a single chip so as to function as a single system.

However, when circuits such as the memory circuit and the logic circuit are integrated in a single chip, this raises such problems that: it is difficult to reduce a voltage of the memory circuit, and it is necessary to perform an additional process for reducing noises occurring in the logic circuit. Further, when an analog circuit which has been conventionally constituted of a bipolar member is provided in combination with other circuits, it is difficult to manufacture the analog circuit by using the same CMOS as the memory circuit and the logic circuit.

Then, more attention is paid not to the system-on chip but to the system-in package, having the same function as the system-on chip, which can be developed in a shorter period and at lower cost.

As a conventional system-in-package semiconductor device, FIG. 9(a) and FIG. 9(b) show examples of a structure of a chip-stacked semiconductor device in which a plurality of semiconductor chips are stacked and wire-bonded. FIG. 9(a) is a plan view obtained by viewing the semiconductor device from above in a stacking direction, and FIG. 9(b) is a cross sectional view taken along E–E' of FIG. 9(a). As shown in FIG. 9(b), the semiconductor device is arranged so that: a substrate 4 constituted of a polyimide substrate or a print substrate is used as a stacking base, and a semiconductor chip 2 and a smaller semiconductor chip 1 are stacked on and above the substrate 4 in this order. By using die-bonding layers 9, the substrate 4 and the semiconductor chip 2 are bonded to each other, and the semiconductor chip 1 and the semiconductor chip 2 are bonded to each other.

The semiconductor chips 1 and 2 respectively have wire-bondable bonding pads 15 . . . and 25 . . . each of which allows conduction with external parts. The bonding pads 15 . . . and 25 . . . are respectively connected to bonding terminals 6 . . . provided on the substrate 4. As shown in FIG. 19(b), in connecting these members, a wire bonding process using a metal wire such as wires 8 . . . is widely used. The wire bonding process is used also in a case where the stacking base is a lead frame.

Note that, there is also a case where the bonding pads of the stacked semiconductor chip are connected not to the bonding terminals provided on the substrate but to bonding pads of another stacked semiconductor chip.

As described above, in the case where the semiconductor chips are stacked and the chip and the substrate are electrically connected to each other by wire bonding, the chips are stacked so that sizes of the chips become smaller upward. This arrangement is made so that the stacked semiconductor chip does not cover the bonding pads of the lower semiconductor chip. The bonding terminals on the substrate are disposed outside the lowermost semiconductor chip. Thus, when the uppermost semiconductor chip and the lowermost semiconductor chip are different from each other in terms of the chip size, a distance between the bonding pad of the uppermost semiconductor chip and the bonding terminal on the substrate is long, so that also a length of the wire is long.

In the system-package semiconductor device arranged in the foregoing manner, when a logic/analog LSI is stacked on a memory LSI and they are wire-bonded to each other, there is the following problem.

It is often that the logic/analog LSI is much smaller than the memory LSI in terms of the chip size. Thus, in the semiconductor device arranged so that the logic/analog LSI which is different from the memory LSI in terms of the chip size is stacked on the memory LSI and they are wire-bonded to each other, the wire is made longer, so that the wire becomes brittle and the wire tends to drop off when the semiconductor chips are sealed. Further, there is such a problem that: the wire hangs down due to its weight, so that the wire touches another wire and the wire touches an edge of the lower semiconductor chip. In order to solve the problem, the following methods were proposed.

For example, Japanese Unexamined Patent Publication No. 257307/2001 (Tokukai 2001-257307)(Publication date: Sep. 21, 2001) discloses such an arrangement that: a semiconductor chip is stacked on another semiconductor chip having a rewiring layer which has been formed on its circuit surface in advance, and the rewiring layer relays a wire-bonding wire which extends from the upper semiconductor chip. Such arrangement makes the wire length for a single loop longer.

Further, Japanese Unexamined Patent Publication No. 76250/2002 (Tokukai 2002-76250)(Publication date: Mar. 15, 2002) discloses such an arrangement that: there is provided a polyimide tape on which a wiring layer for relaying a wire-bonding wire is disposed between the upper semiconductor chip and the lower semiconductor chip. Such arrangement makes the wire length for a single loop longer.

However, in the conventional semiconductor device having the rewiring layer on its circuit surface as described above, it is necessary to perform a step of additionally forming the rewiring layer for relaying the wire-bonding wire on the semiconductor chip that has been completely formed. Thus, this raises such a problem that: an electric property of a semiconductor element in the semiconductor chip having the rewiring layer deteriorates due to damages brought about by sputtering an aluminium film and performing a photolithography process such as exposure and etching process that are performed during the step of forming the rewiring layer.

Further, in forming wirings of the rewiring layer, when an etching resist is formed or removed during a step of additionally forming an insulating layer on the bonding pad of the semiconductor chip that has been completely formed, an impure material remains on a surface of the bonding pad. Then, this raises such a problem that the impure material deteriorates the bonding strength of the wire bonding.

Further, in wire bonding, when stress is exerted on the bonding pad of the rewiring layer formed on the semiconductor chip having the rewiring layer, the semiconductor element formed under the bonding pad of the rewiring layer may be damaged by the stress.

Further, in the semiconductor device having the wiring layer obtained by forming wirings on a polyimide tape, there is such a problem that: it is more difficult to form fine wirings than the technique of forming the rewiring layer on the semiconductor chip as described above. This is based on the following reason: since these techniques are different from each other in terms of a material and a photoresist device, in case of forming the rewiring layer on the semiconductor chip, a minimum wiring pitch can be set to not more than 1 μm, but in case of forming wirings on the polyimide tape, a minimum wiring pitch can be set to 50 to 60 μm at most in accordance with a current technique.

Further, polyimide which is a material for the wiring layer can more easily absorb water than other materials. Thus, this may bring about so-called reflow crack. The reflow crack is such that: when the semiconductor package is installed onto the substrate in accordance with thermal reflow, absorbed water swells, so that the wiring layer and the semiconductor chip formed thereon respectively exfoliate. Thus, this raises such a problem that the quality of the semiconductor device deteriorates.

SUMMARY OF THE INVENTION

The present invention was devised in view of the foregoing problem, and its object is to provide a semiconductor device which prevents a function element (circuit element, semiconductor element) such as a memory element and a logic element formed in each of plural semiconductor chips stacked on a stacking base from being damaged in terms of an electric property, and prevents the wire bonding strength from dropping, and allows a fine wiring pitch of wirings for relaying a wire-bonding wire to be formed thereon.

In order to solve the foregoing problems, the semiconductor device of the present invention, in which one or more semiconductor chips each having an externally leading electrode are stacked on a stacking base, includes an interposer chip on which one or more connection wirings are formed, wherein: the externally leading electrode provided on at least one of the semiconductor chips is connected to the connection wiring of the interposer chip by wire bonding, and the external leading electrode, connected to the connection wiring, which is provided on the semiconductor chip, relays the connection wiring so as to be electrically connected to an electrode of a wiring provided on the stacking base or another of the semiconductor chips.

According to the arrangement, the interposer chip having one or more connection wirings is provided, for example, between the stacked semiconductor chips, or on the stacking base so as to be positioned on the upper side in a stacking direction. Further, the externally leading electrode provided on the semiconductor chip is connected to the connection wiring of the interposer chip, and relays the connection wiring so as to be electrically connected to an electrode of the stacking base or another semiconductor chip. In this manner, when connecting the externally leading electrode provided on the semiconductor chip to the electrode of the stacking base or another semiconductor chip, it is possible to relay the interposer chip, so that it is possible to shorten the length of a wire in wire bonding. Thus, it is possible to suppress such a problem that: the wire becomes brittle when the wire is long, and the wire hangs down due to its weight, which causes the wire to touch another wire and causes the wire to touch an edge of the lower semiconductor chip.

Here, unlike a conventional semiconductor device in which a rewiring layer is provided on any one of the stacked semiconductor chips, in the structure according to the present invention, the interposer chip having the connection wiring is used, so that it is not necessary to perform a step such as sputtering and photolithography for forming a rewiring layer on the semiconductor chip in which the wirings are formed. Thus, this arrangement does not raise such a problem that formation of the rewiring layer deteriorates an electric property of the semiconductor element in the semiconductor chip.

Further, in the conventional semiconductor device in which the rewiring layer is provided on the semiconductor chip, the rewiring layer is formed after forming a bonding pad on the semiconductor chip as an electrode. Thus, it is necessary to form and remove an etching resist, so that an impure material remains on a surface of the bonding pad. As a result, the connection strength in wire bonding drops. On the other hand, in the structure according to the present invention, the rewiring layer is not formed, so that the connection strength in wire bonding does not drop. Further, in the conventional semiconductor device, when a stress is exerted on the rewiring layer in wire bonding, the wirings of the semiconductor chip positioned beneath the rewiring layer may be damaged. However, in the structure according to the present invention, a thickness and hardness of the interposer chip prevent the stress exerted in wire bonding.

Thus, according to the arrangement, it is possible to prevent the semiconductor element formed in each of the plural semiconductor chips stacked on the stacking base from deteriorating in terms of an electric property and from being physically damaged, and it is possible to improve the wire bonding strength.

For a fuller understanding of the nature and advantages of the invention, reference should be made to the ensuing detailed description taken in conjunction with the accompanying drawings.

BRIEF DESCRIPTION OF THE DRAWINGS

FIG. 9(a) is a plan view showing a structure of a conventional semiconductor device.

FIG. 9(b) is a cross sectional view taken along E–E' of FIG. 9 (a).

DESCRIPTION OF THE EMBODIMENTS

[Embodiment 1]

The following description will explain one embodiment of the semiconductor device of the present invention with reference to FIG. 1(a) and FIG. 1(b). Note that, the present invention is not limited to this.

FIG. 1(a) is a plan view obtained by viewing the semiconductor device of the present embodiment from above in a stacking direction, and FIG. 1(b) is a cross sectional view taken along A–A' of FIG. 1(a).

(Structure of the Semiconductor Device)

Figure 1:
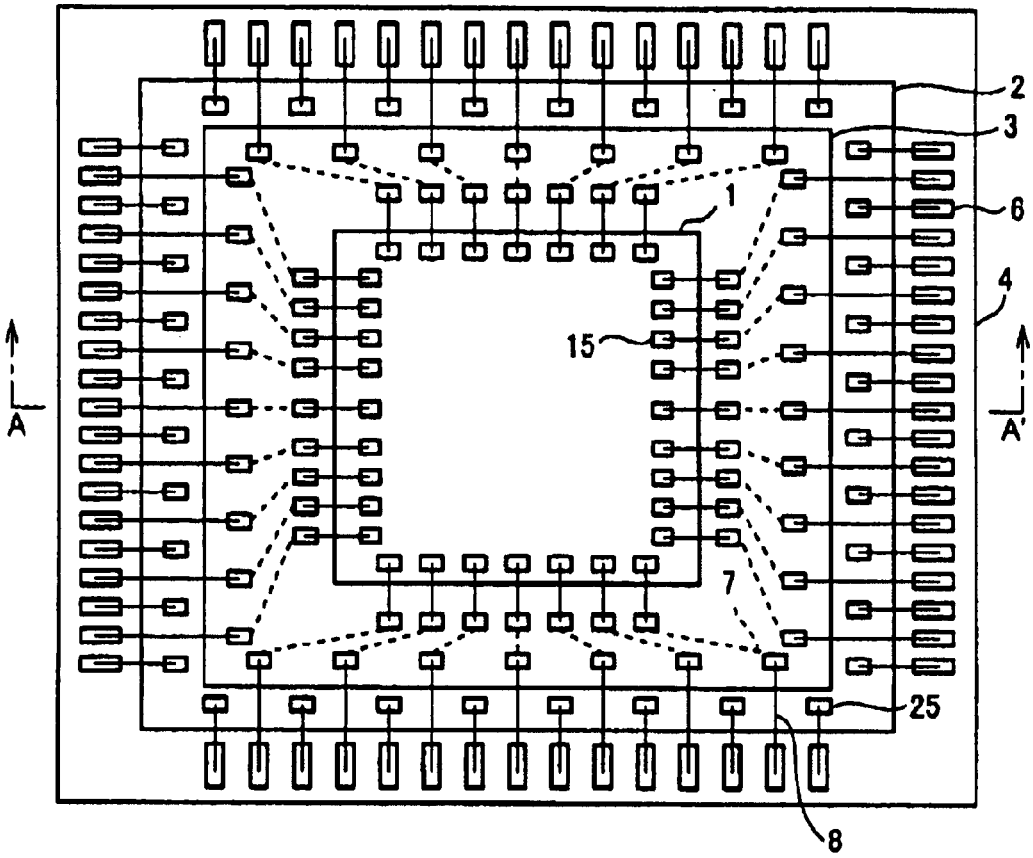
FIG. 1(a) is a plan view showing a structure of a semiconductor device according to Embodiment 1 of the present invention.
FIG. 1(b) is a cross sectional view taken along A–A' of FIG. 1 (a).
Figure 1:
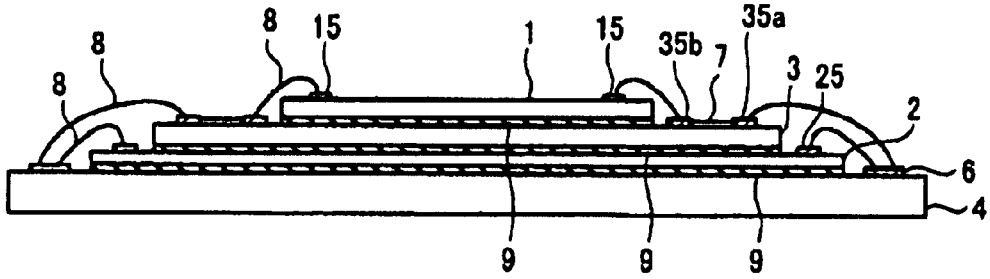

As shown in FIG. 1 (a) and FIG. 1 (b), the semiconductor device of the present embodiment is arranged so that: a substrate 4 is used as a stacking base, and a semiconductor chip 2, an interposer chip 3, and a semiconductor chip 1 are stacked on and above the stacking base in this order. Note that, by using die-bonding layers 9, the substrate 4 and the semiconductor chip 2 are bonded to each other, and the semiconductor chip 2 and the interposer chip 3 are bonded to each other, and the interposer chip 3 and the semiconductor chip 1 are bonded to each other.

The substrate 4 is constituted of a member obtained by forming a wiring layer on an insulating layer such as a thin plate made of inorganic substance. On the wiring layer, there are formed bonding terminals 6 . . . for allowing the substrate 4 to be connected to the semiconductor chips 1 and 2. Each of the bonding terminals 6 . . . is used as an electrode pad of an externally leading electrode for allowing conduction with the outside, and as a bonding pad to be wire-bonded. Note that, as the thin plate made of inorganic substance, a resin film, a glass cloth base material in which resin contained, ceramic, and the like are preferably used. Further, in case of providing a semiconductor device having a production model size, a lead frame may be used as the substrate 4. When an insulating resin substrate is used, it is possible to provide a high-density-installation-type semiconductor device.

The semiconductor chip 1 includes a wiring (not shown) formed on an upper side in the stacking direction and bonding pads 15 . . . . The semiconductor chip 2 includes a wiring (not shown) formed on an upper side in the stacking direction and bonding pads 25 . . . . Each of the bonding pads 15 . . . is used as an electrode pad of an externally leading electrode for making conduction with the outside, and as a bonding pad to be wire-bonded. Further, each of the bonding pads 25 . . . is used as an electrode pad of an externally leading electrode for making conduction with the outside, and as a bonding pad to be wire-bonded. Each of the semiconductor chips 1 and 2 is ordinarily arranged so that a function element (circuit element) such as a transistor is formed on a silicon substrate. It is preferable that the wiring layer of the semiconductor chip 1 is covered by an insulating film referred as a passivation film (surface protection film) made of Si or polyimide so that the bonding pads 15 . . . are uncovered, and it is preferable that the wiring layer of the semiconductor chip 2 is covered by an insulating film referred as a passivation film (surface protection film) made of Si or polyimide so that the bonding pads 25 . . . are uncovered.

The interposer chip 3 is formed as a dummy semiconductor chip which has no function element. A wiring layer is provided on the interposer chip 3. The wiring layer has wire-bondable first bonding pads 35a . . . , wire-bondable second bonding pads 35b . . . , and wirings 7 . . . , that make conduction with the outside. In the wiring layer, the first bonding pads 35a . . . are disposed on the side near to the semiconductor chip 2, and the second bonding pads 35b . . . are disposed on the side nearer to the semiconductor chip 1 than the first bonding pads 35a . . . . Each of the wirings 7 . . . connects each of the first bonding pads 35a . . . to each of the second bonding pads 35b . . . . In the present embodiment, connection wirings extend from the wirings 7 . . . , the first bonding pads 35a . . . , and the second bonding pads 35b . . . .

Note that, an arrangement of the connection wiring is not limited to the foregoing arrangement. For example, in case where it is possible to directly wire-bond the wirings 7 . . . , it is not necessary to provide the bonding pads on the connection wirings. Further, only the first bonding pads 35a . . . may be used as the connection wirings.

In the present embodiment, the first bonding pads 35a . . . are disposed along a periphery of the interposer chip 3. Further, the second bonding pads 35b . . . are disposed along a periphery of the semiconductor chip 1 so as to be surrounded by the bonding pads 35a . . . . Further, all the wirings 7 . . . are disposed in all directions from the second bonding pads 35b . . . to the first bonding pads 35a . . . so as not to cross each other. Note that, it is preferable that a surface of the wiring layer is covered by a passivation film so that the first bonding pads 35a . . . and the second bonding pads 35b . . . are uncovered.

The interposer chip 3 is formed by using a wafer made of the same material and having the same structure as those of a wafer used in forming the semiconductor chip 1 and/or the semiconductor chip 2 stacked above/on the substrate 4. Further, by using the same process and device as in forming the wiring layer on the semiconductor chip 1 and/or the semiconductor chip 2 stacked above/on the substrate 4, the first bonding pads 35a . . . , the second bonding pads 35b . . . , and the wirings 7 . . . are formed on the interposer chip 3. Thus, in forming the interposer chip 3, it is possible to use the same process and device as in forming the semiconductor chip 1 and/or the semiconductor chip 2, so that it is possible to reduce the manufacturing cost and the manufacturing time that are required in forming the interposer chip 3. Further, when the wiring layer is formed on the wafer used in forming the semiconductor chip 1 and/or the semiconductor chip 2, it is possible to set the minimum wiring pitch to be not more than 1 μm, so that it is possible to form the wiring layer of the interposer chip 3 in such a fine manner that the wiring pitch is not more than 1 μm.

In the present embodiment, the wire bonding is performed by using the interposer chip 3. Each of the bonding pads 15 . . . on the semiconductor chip 1 and each of the bonding terminals 6 . . . on the substrate 4 are electrically connected to each other via each of the wires 8 and the interposer chip 3. Note that, as the wires 8, particularly, a fine wire made of gold or aluminium are preferably used.

(Steps of Manufacturing the Semiconductor Device)

The following description will sequentially explain the steps of manufacturing the semiconductor device of the present embodiment.

(a) The semiconductor chip 2, the interposer chip 3, and the semiconductor chip 1 are provided on and above the upper surface of the substrate 4 in this order and then are fixed. By using the die-bonding layers 9, the respective chips are bonded to each other, and the semiconductor chip 2 and the substrate 4 are bonded to each other.

(b) The bonding pads 25 . . . on the semiconductor chip 2 and the bonding terminals 6 . . . on the substrate 4 are electrically connected to each other via the wires 8 . . . .

(c) The bonding pads 15 . . . on the semiconductor chip 1 and the second bonding pads 35b . . . on the interposer chip 3 are electrically connected to each other via the wires 8 . . . .

(d) The first bonding pads 35a . . . on the interposer chip 3 and some of the bonding terminals 6 . . . that are not connected to the bonding pads 25 . . . are electrically connected to each other via the wires 8 . . . .

As described above, the second bonding pads 35b . . . and the first bonding pads 35a . . . are respectively connected to each other via the wirings 7 . . . Thus, the wires 8 . . . electrically connect the bonding pads 15 . . . on the semiconductor chip 1 to the bonding terminals 6 . . . on the substrate 4 via the second bonding pads 35b . . . , the wirings 7 . . . , and the first bonding pads 35a . . . .

Note that, as shown in FIG. 1(a), the wires 8 . . . connected to the bonding terminals 6 . . . do not cross each other in a horizontal direction, so that the wires 8 . . . for connecting the bonding terminals 6 . . . to the bonding pads 25 . . . on the semiconductor chip 2 do not exist under the wires 8 . . . for connecting the bonding terminals 6 . . . to the first bonding pads in the cross sectional view taken along A–A'. However, in order to show that the wires 8 . . . connected to the bonding terminals 6 . . . do not cross each other in a vertical direction, FIG. 1(b) shows a condition of the wire bonding different from a condition shown in FIG. 1(a) for convenience in description.

Further, in the present embodiment, as shown in FIG. 1(a), the wires 8 . . . are respectively wire-bonded so as not to cross each other. This is based on the following two reasons. That is, (a) the bonding pads 35b . . . of the interposer chip 3 are disposed around the semiconductor chip 1 so as to be in the same order as that of the bonding pads 15 . . . , and (b) the bonding pads 35a . . . of the interposer chip 3 are wire-bonded to the bonding terminals 6 . . . so as to intervene between the wires 8 . . . which connect the bonding pads 25 . . . of the semiconductor chip 2 to the bonding terminals 6 . . . of the substrate 4. Due to such arrangement, the wires 8 . . . do not touch each other, so that it is possible to prevent a disadvantage such as short circuit, thereby ensuring electric connection between the electrodes of the semiconductor chip 1 and the electrodes of the substrate 4.

Further, in the present embodiment, all the bonding pads 15 . . . of the semiconductor chip 1 are connected to the second bonding pads 35b . . . of the interposer chip 3, but may be connected to the bonding pads 25 . . . of the semiconductor chip 2. That is, it may be so arranged that: bonding pads on an semiconductor chip are connected to bonding pads on another semiconductor chip.

[Embodiment 2]

Figure 2:
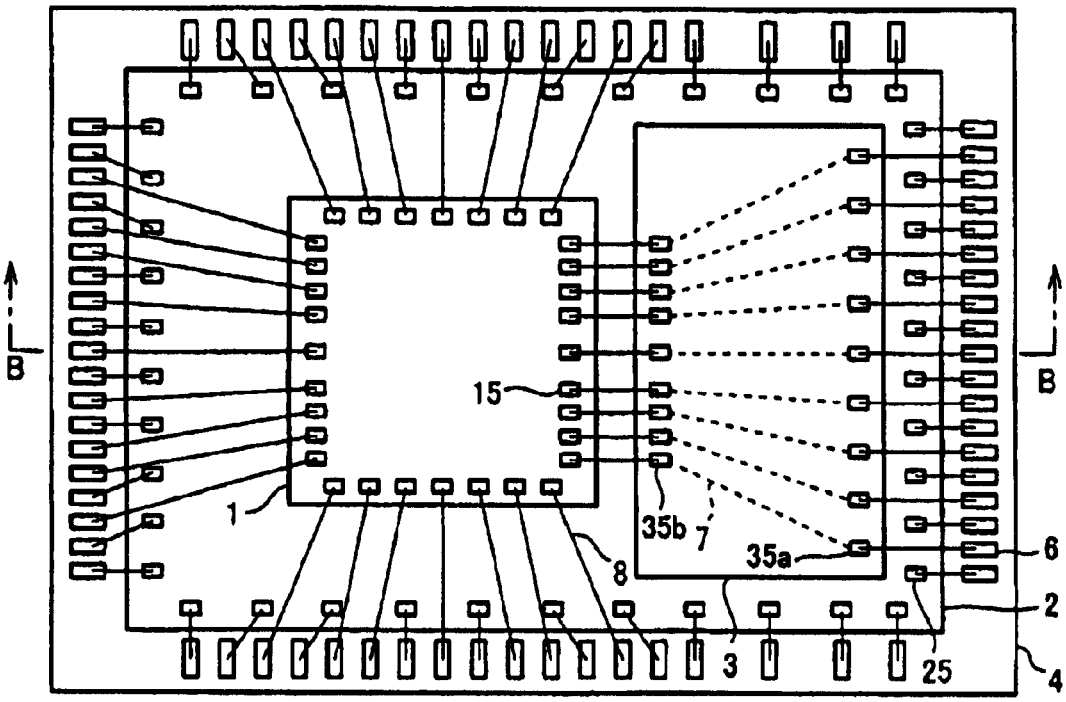
FIG. 2(a) is a plan view showing a structure of a semiconductor device according to Embodiment 2 of the present invention.
FIG. 2(b) is a cross sectional view taken along B–B' of FIG. 2 (a).
Figure 2:
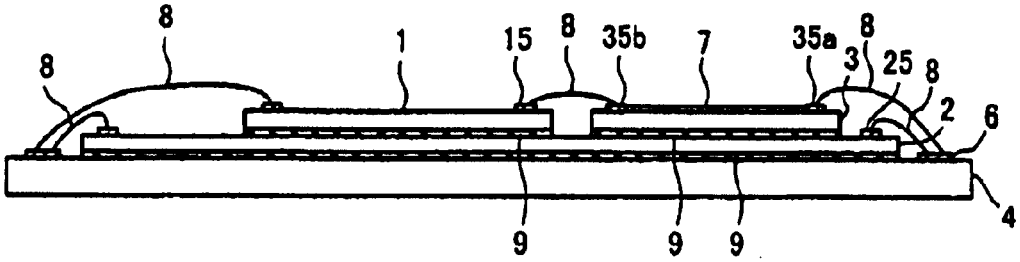

The following description will explain another embodiment of the semiconductor device of the present invention with reference to FIG. 2(c) and FIG. 2(b). Note that, for convenience in description, same reference signs are given to members having the same function as members described in Embodiment 1, and description thereof is omitted.

FIG. 2(a) is a plan view obtained by viewing the semiconductor device of the present embodiment from above in a stacking direction, and FIG. 2(b) is a cross sectional view taken along B–B' of FIG. 2(b). As shown in FIG. 2(a) and FIG. 2(b), the semiconductor device of the present embodiment is arranged so that: the semiconductor chip 2 is stacked on an upper surface of the substrate 4, and the semiconductor chip 1 and the interposer chip 3 are stacked thereon so as to be positioned side by side. Note that, by using die-bonding layers 9, the substrate 4 and the semiconductor chip 2 are bonded to each other, and the semiconductor chip 2 and the interposer chip 3 are bonded to each other, and the semiconductor chip 2 and the semiconductor chip 1 are bonded to each other.

In bonding pads 15 . . . disposed on peripheral sides of the semiconductor chip 1, some pads that are positioned near the interposer chip 3 are connected to second bonding pads 35b . . . of the interposer chip 3 via wires 8 . . . . The second bonding pads 35b . . . and first bonding pads 35a . . . are connected to each other by wirings 7 . . . . Further, the first bonding pads 35a . . . and bonding terminals 6 . . . are connected by the wires 8 . . . . Further, by the wires 8 . . . , some of the bonding pads 15 . . . that are not connected to the second bonding pads 35b . . . and bonding pads 25 . . . of the semiconductor chip 2 are connected to some of the bonding terminals 6 . . . that are not connected to the first bonding pads 35a . . . . That is, only the bonding pads 15 . . . disposed on a peripheral side near the interposer chip 3 are electrically connected to the bonding terminals 6 . . . of the substrate 4 via the wires 8 . . . and the interposer chip 3.

As steps of manufacturing the semiconductor device of the present embodiment, first, the semiconductor chip 2 is formed on the upper surface of the substrate 4, and the interposer chip 3 and the semiconductor chip 1 are formed on the semiconductor chip 2 so as to be positioned side by side, and they are fixed. By using the die-bonding layers 9, the substrate 4 and the semiconductor chip 2 are bonded to each other, and the semiconductor chip 2 and the semiconductor chip 1 are bonded to each other, and the semiconductor chip 2 and the interposer chip 3 are bonded to each other. Next, the bonding pads 25 . . . on the semiconductor chip 2 and the bonding terminals 6 . . . on the substrate 4 are connected to each other via the wires 8 . . . .

Next, the bonding pads 15 . . . disposed on a peripheral side of the semiconductor chip 1 which side is positioned near the interposer chip 3 and the second bonding pads 35b . . . on the interposer chip 3 are electrically connected to each other via the wires 8 . . . Next, the first bonding pads 35a on the interposer chip 3 and some of the bonding terminals 6 . . . that are not connected to the bonding pads 25 . . . on the semiconductor chip 2 are electrically connected to each other via the wires 8 . . . .

Further, (i) some bonding pads 15 . . . other than the bonding pads 15 . . . disposed on a peripheral side of the semiconductor chip which side is near the interposer chip 3 and (ii) some bonding terminals 6 . . . other than the bonding terminals 6 . . . connected to the bonding pads 25 . . . on the semiconductor chip 2 and the first bonding pads 35a on the interposer chip 3, are electrically connected to each other via the wires 8 . . . .

Note that, as in FIG. 1(b), in order to show that the wires 8 . . . connected to the bonding terminals 6 . . . do not cross each other, for convenience in description, FIG. 2(b) shows a condition of the wire bonding which is different from a condition shown in FIG. 2(a).

As arranged in the present embodiment, the semiconductor chip 1 and the interposer chip 3 are disposed side by side on the semiconductor chip 2 and there is an area which allows wire bonding. As long as such arrangement is made, even when the interposer chip is stacked, it is possible to manufacture the semiconductor device without increasing a thickness of the stacked chips.

[Embodiment 3]

Figure 3:
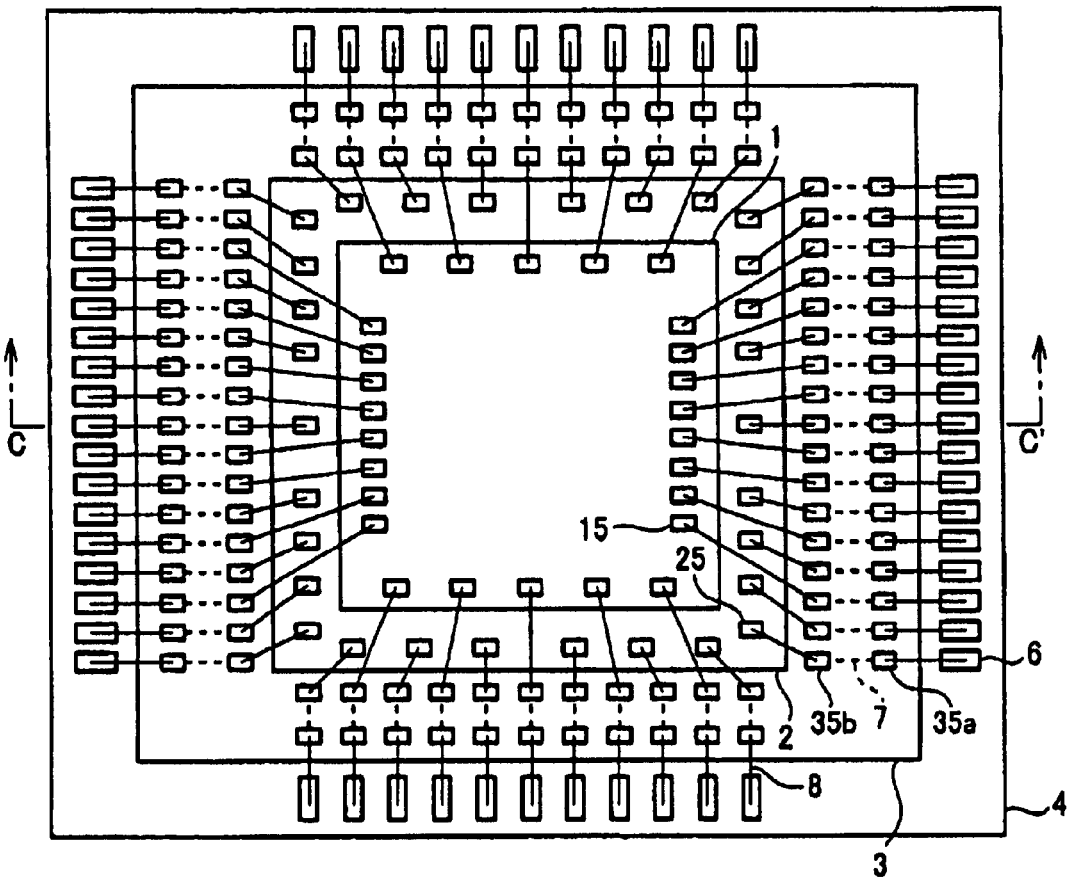
FIG. 3(a) is a plan view showing a structure of a semiconductor device according to Embodiment 3 of the present invention.
FIG. 3(b) is a cross sectional view taken along C–C' of FIG. 3(a).
Figure 3:
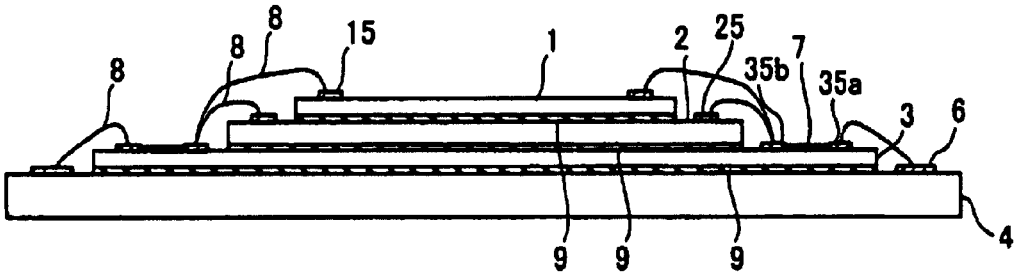

The following description will explain still another embodiment of the semiconductor device of the present invention with reference to FIG. 3(a) and FIG. 3(b). Note that, for convenience in description, the same reference signs are given to members having the same functions as members described in Embodiment 1, and description thereof is omitted.

FIG. 3(a) is a plan view obtained by viewing the semiconductor device of the present embodiment from above in a stacking direction, and FIG. 3(b) is a cross sectional view taken along C–C' of FIG. 3(a). As shown in FIG. 3(a) and FIG. 3(b), the semiconductor device of the present embodiment is arranged so that: the interposer chip 3 is stacked on an upper surface of the substrate 4, and the semiconductor chips 1 and 2 are stacked thereon and thereabove in this order. That is, in the present embodiment, the interposer chip 3 is formed between the substrate 4 and the semiconductor chip 2.

The bonding pads 15 . . . of the semiconductor chip 1 and the bonding pads 25 . . . of the semiconductor chip 2 are connected to the second bonding pads 35b . . . of the interposer chip 3 so that each bonding pad 15 corresponds to one second bonding pad 35b and each bonding pad 25 corresponds another second bonding pad 35b. The second bonding pads 35b . . . and the first bonding pads 35a . . . are connected to each other by the wirings 7 . . . . Further, the first bonding pads 35a . . . and the bonding terminals 6 . . . of the substrate 4 are connected to each other by the wires 8 . . . . That is, the bonding pads 15 . . . of the semiconductor chip 1 and the bonding pads 25 . . . of the semiconductor chip 2 are electrically connected to the bonding terminals 6 . . . on the substrate 4 via the wires 8 . . . and the interposer chip 3.

As steps of manufacturing the semiconductor device of the present embodiment, first, the interposer chip 3, the semiconductor chip 2, and the semiconductor chip 1 are stacked on and above the substrate 4 in this order, and they are fixed. By using die-bonding layers 9, the respective chips are bonded to each other, and the interposer chip 3 and the substrate 4 are bonded to each other. Next, the first bonding pads 35 . . . on the interposer chip 3 and the bonding terminals 6 . . . on the substrate 4 are electrically connected to each other via the wires 8 . . . . The bonding pads 15 . . . on the semiconductor chip 1 and the second bonding pads 35b . . . on the interposer chip 3 are electrically connected to each other via the wires 8 . . . Further, (i) the bonding pads 25 . . . on the semiconductor chip 2 and (ii) some second bonding pads 35b . . . on the interposer chip 3 other than the second bonding pads 35b . . . connected to the bonding pads 15 . . . on the semiconductor chip 1, are electrically connected to each other via the wires 8 . . . .

Note that, for convenience in description, in order to show that the wires 8 . . . connected to the bonding terminals 6 . . . do not cross each other, as in FIG. 1(b), FIG. 3(b) shows a condition of the wire bonding that is different from a condition shown in FIG. 3(a).

According to the foregoing arrangement, it is possible to make electric connection by using the interposer chip even when the semiconductor chip 2 is much smaller than the substrate 4.

[Embodiment 4]

Figure 4:
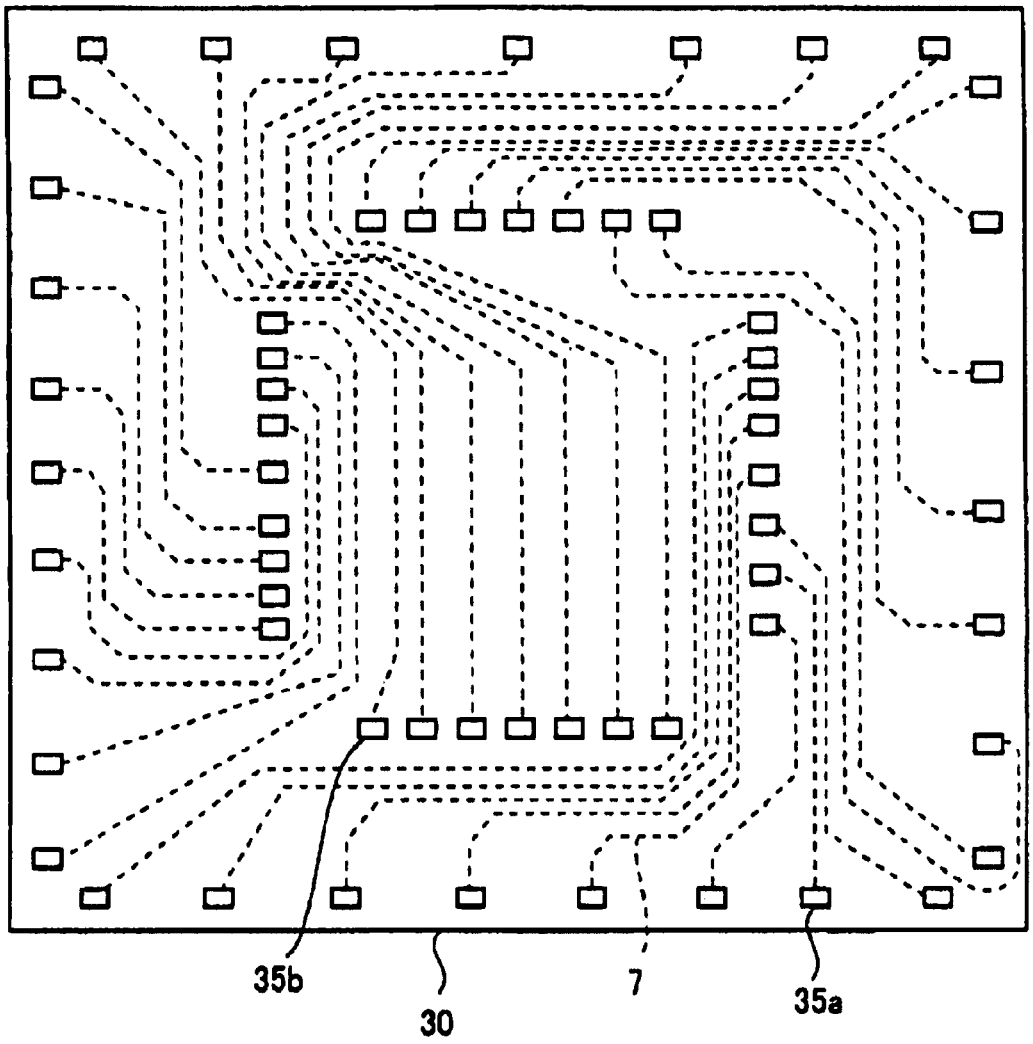
FIG. 4 is a plan view showing a structure of an interposer chip of a semiconductor device according to Embodiment 4 of the present invention.
Figure 5:
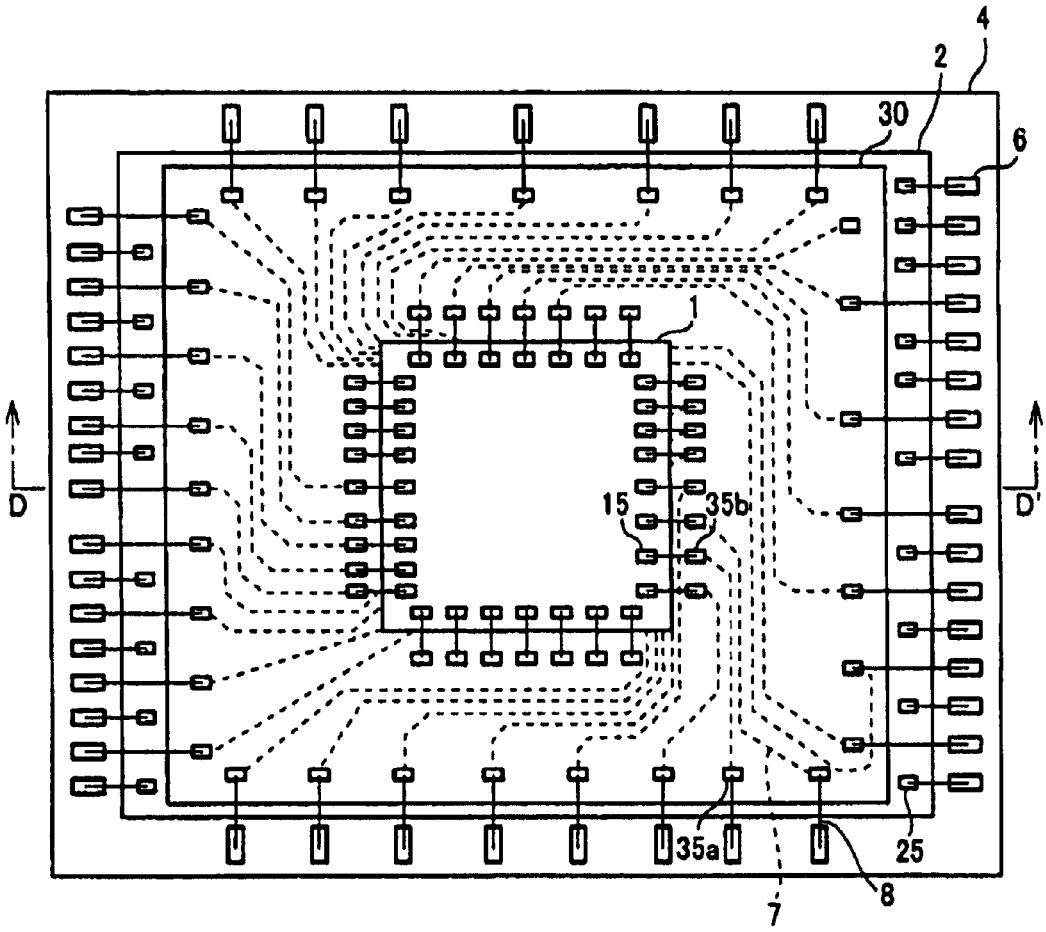
FIG. 5(a) is a plan view of the semiconductor device in which semiconductor chips are stacked on and above the interposer chip shown in FIG. 4.
FIG. 5(b) is a cross sectional view taken along D–D' of FIG. 5(a).
Figure 5:
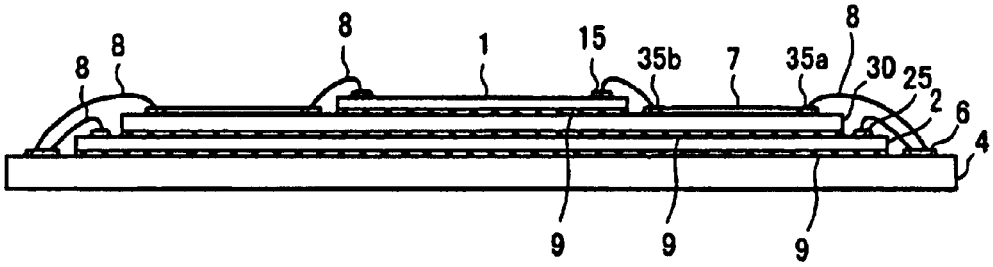

The following description will explain further another embodiment of the semiconductor device of the present invention with reference to FIG. 4, FIG. 5(a), and FIG. 5(b). Note that, for convenience in description, the same reference signs are given to members having the same function of members described in Embodiment 1, and description thereof is omitted.

FIG. 4 is a plan view of an interposer chip which is different from the interposer chips of Embodiments 1 to 3 in terms of wirings for connecting first bonding pads to second bonding pads. As shown in FIG. 4, in the interposer chip 30 of the present embodiment, as in the interposer chip 3 shown in FIG. 1(a) of Embodiment 1, the first bonding pads 35a . . . are disposed along peripheral sides of the interposer chip 3. Further, the second bonding pads 35b . . . are disposed so as to be surrounded by the first bonding pads 35a . . . and so as to be positioned along peripheral sides of a chip stacked on the interposer chip 3.

Further, the first bonding pads 35a . . . and the second bonding pads 35b . . . are connected to each other by wirings 7 . . . . Each of the wirings 7 . . . connects each of the first bonding pads 35a . . . to each of the second bonding pads 35b . . . .

In Embodiment 1, all the wirings 7 . . . are disposed in all directions from the second bonding pads 35b . . . to the first bonding pads 35a . . . so as not to cross each other. In the present embodiment, a condition under which the wirings 7 . . . are disposed is more complicate. This is described as follows.

Here, a chip or a substrate that is provided on the lower side of the interposer chip 3 is referred to as a lower layer substrate, and a chip stacked on an upper side of the interposer chip 3 is referred to as an upper layer substrate. Further, a plurality of bonding pads on the lower layer substrate and a plurality of bonding pads on the upper layer substrate are respectively connected to each other via the first bonding pads 35a . . . , the wirings 7 . . . , and the second bonding pads 35b.

At this time, in case where an order in which the plurality of bonding pads on the lower layer substrate are disposed is different from an order in which the plurality of bonding pads on the upper layer substrate, when the wirings 7 . . . are disposed as in Embodiment 1, this raises the following problem. That is, the wires 8 . . . which connect (i) the plurality of bonding pads on the upper layer substrate or the lower layer substrate to (ii) the first bonding pads 35a . . . or the second bonding pads 35b . . . cross each other.

Then, in the present embodiment, the first bonding pads 35a . . . and the second bonding pads 35b . . . are disposed so that the wires 8 . . . which connect the plurality of bonding pads on the upper layer substrate to the second bonding pads 35b . . . do not cross each other and the plurality of bonding pads on the lower layer substrate to the first bonding pads 35a . . . do not cross each other. Further, the wirings 7 are disposed in a roundabout manner so that the first bonding pads 35a . . . and the second bonding pads 35b . . . are respectively connected to each other so as to correspond to each other. The wirings 7 . . . are disposed in a roundabout manner so as not to cross each other.

For example, FIG. 4 shows a condition under which at least one part of the wirings 7 . . . connects (i) the first bonding pads 35a . . . disposed along one side of the interposer chip 3 to (ii) the second bonding pads 35b . . . disposed along one side of an upper chip which side is not positioned nearest to the foregoing one side of the interposer chip 3. Further, the wirings 7 . . . are disposed so that none of the wirings 7 . . . cross each other. Note that, it may be so arranged that: the wirings 7 . . . connect the first bonding pads 35a . . . disposed along one side of the interposer chip 3 to the second bonding pads 35b . . . disposed along one side of an upper chip which side is positioned nearest to the foregoing one side.

In this manner, an entire length of the connection wiring is not necessarily shortest. That is, as long as the wirings 7 . . . connect the first bonding pads 35a . . . to the second bonding pads 35b . . . respectively so that the wirings 7 . . . do not cross each other, it is possible to dispose the wirings 7 . . . in any manner.

FIG. 5(a) is a plan view obtained by viewing the semiconductor device having the interposer chip shown in FIG. 4 from above in a stacking direction, and FIG. 5(b) is a cross sectional view taken along D–D' of FIG. 5(a). As shown in FIG. 5(a) and FIG. 5(b), the semiconductor device of the present embodiment is arranged so that: the semiconductor chip 2, the interposer chip 30, and the semiconductor chip 1 are stacked on and above an upper surface of the substrate 4 in this order. Note that, by using die-bonding layers 9, the substrate 4 and the semiconductor chip 2 are bonded to each other, and the semiconductor chip 2 and the interposer chip 30 are bonded to each other, and the interposer chip 3 and the semiconductor chip 1 are bonded to each other.

All the wires 8 . . . are wire-bonded in the same manner as in FIG. 1(a) and FIG. 1(b).

As in FIG. 1 (a) and FIG. 1 (b), also in the semiconductor device of the present embodiment, the second bonding pads 35b . . . and the first bonding pads 35a . . . are respectively connected to each other by the wirings 7 . . . . Thus, the wires 8 . . . electrically connect the bonding pads 15 . . . to the bonding terminals 6 . . . via the second bonding pads 35b . . . , the wirings 7 . . . , and the first bonding pads 35a . . . .

According to the foregoing arrangement of the wirings 7 . . . , even when an order in which the bonding pads 15 . . . of the semiconductor chip 1 are disposed is different from an order in which the bonding terminals 6 . . . of the substrate 4 are disposed, it is possible to electrically connect the corresponding terminals to each other so that the wires 8 . . . do not cross each other. Thus, it is not necessary to design the wirings so as to respectively correspond to the stacked semiconductor chips on the substrate 4, so that it is easier to design and manufacture the substrate 4.

[Embodiment 5]

Figure 6:
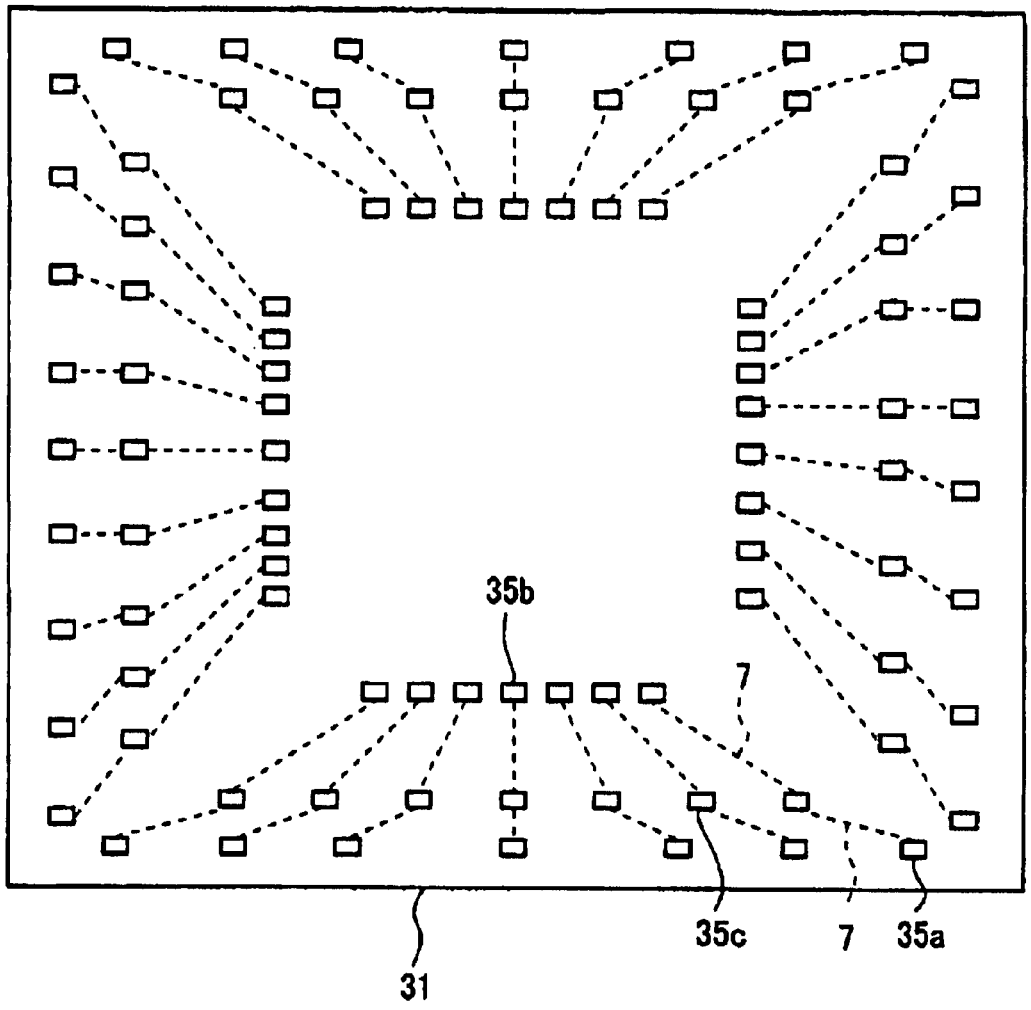
FIG. 6 is a plan view showing an interposer chip of a semiconductor device according to Embodiment 5 of the present invention.
Figure 7:
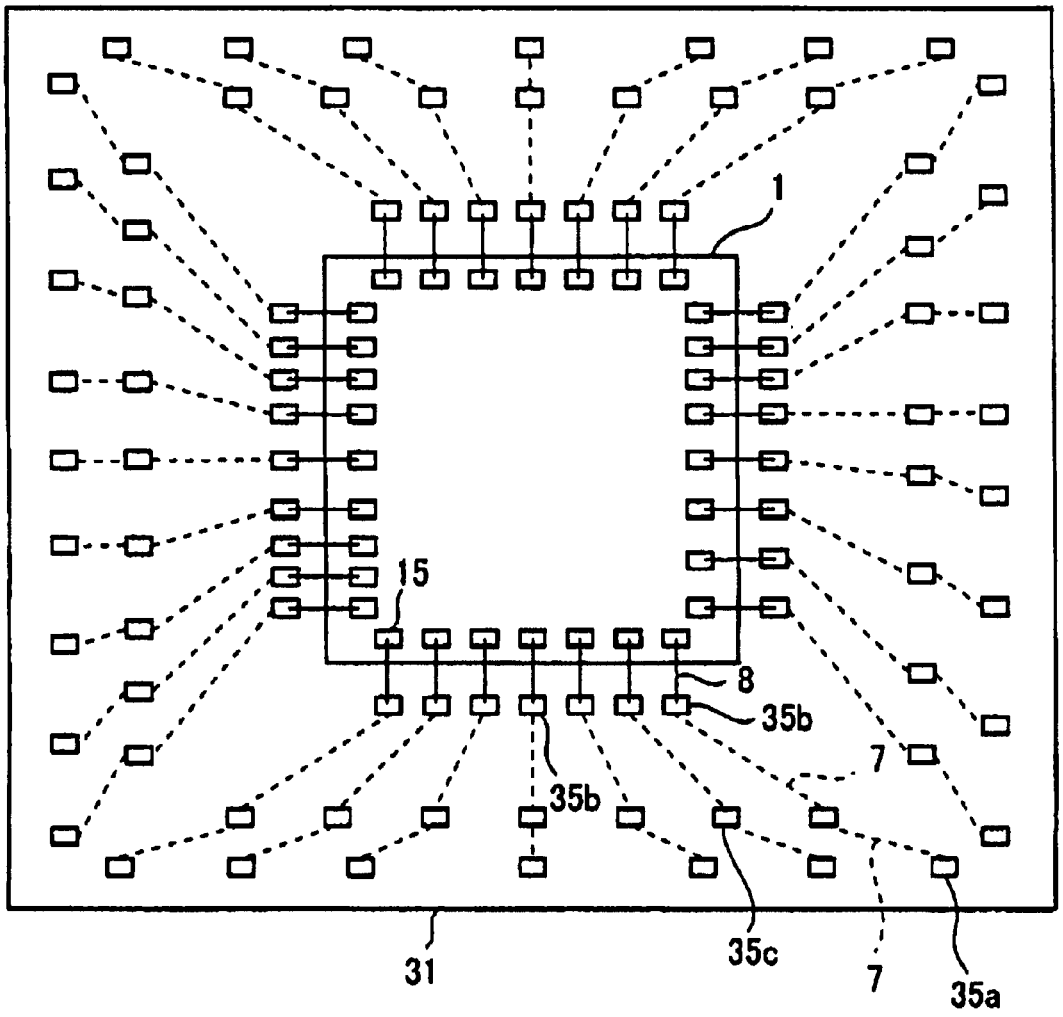
FIG. 7 is a plan view of the semiconductor device in which semiconductor chips are stacked on and above the interposer chip shown in FIG. 6.
Figure 8:
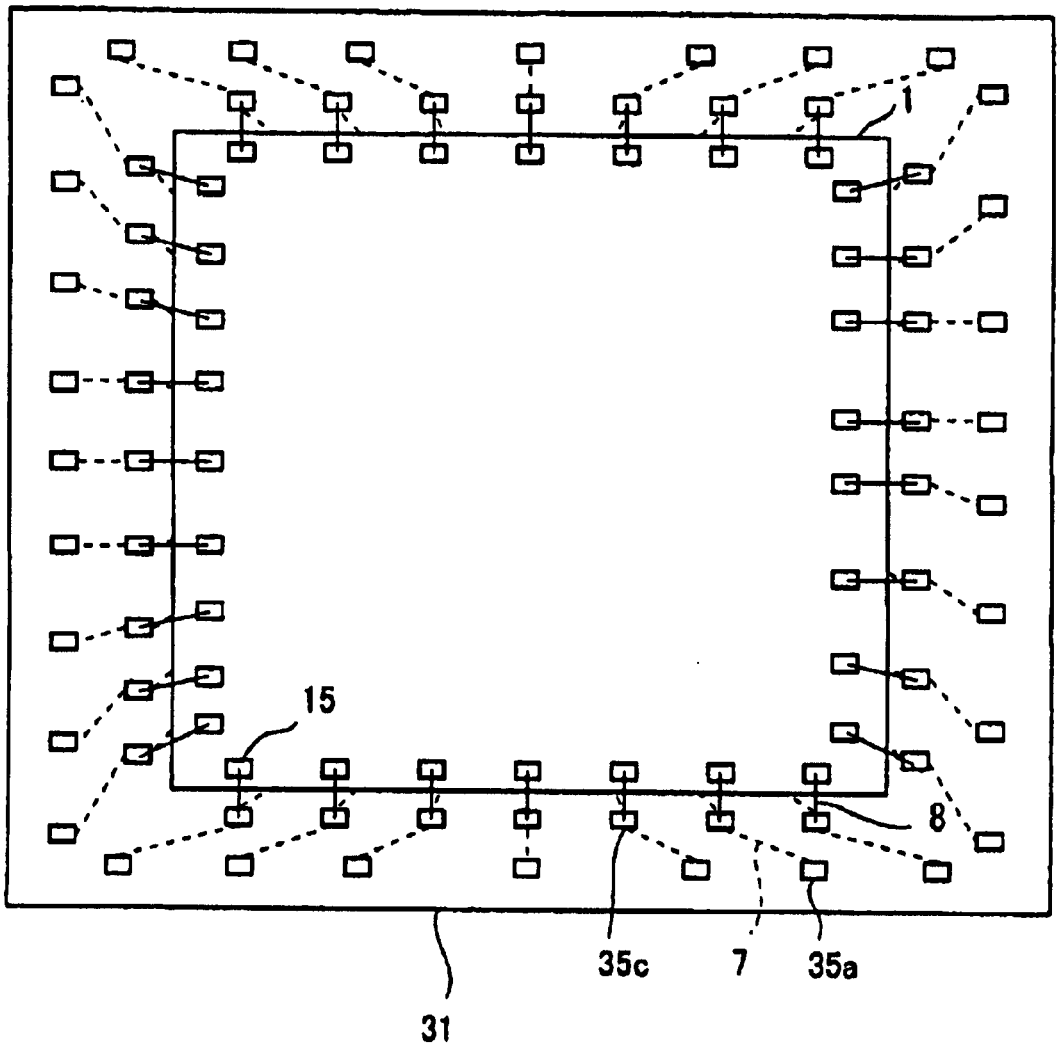
FIG. 8 is a plan view of a semiconductor device in which other semiconductor chips are stacked on and above the interposer chip of FIG. 6.

The following description will explain still further another embodiment of the semiconductor device of the present invention with reference to FIG. 6 to FIG. 8. Note that, for convenience in description, the same reference signs are given to members having the same functions as members described in Embodiment 1, and description thereof is omitted.

FIG. 6 is a plan view of an interposer chip on which third bonding pads are formed between a line of the first bonding pads and a line of the second bonding pads as additional bonding pads. As shown in FIG. 6, an interposer chip 31 includes the third bonding pads 35c provided between a line of the first bonding pads 35a . . . and a line of the second bonding pads 35b . . . . Each of the wirings 7 . . . connects each of the first bonding pads 35a . . . to each of the third bonding pads 35c . . . , and connects each of the third bonding pads 35c . . . to each of the second bonding pads 35b . . . .

In the present embodiment, the first bonding pads 35a . . . are disposed along peripheral sides of the interposer chip 3. Further, the third bonding pads 35c . . . are disposed so as to be surrounded by the first bonding pads 35a . . . and so as to be positioned along the first bonding pads 35a . . . . Further, the second bonding pads 35b . . . are disposed so as to be surrounded by the third bonding pads 35c . . . and so as to be positioned along the third bonding pads 35c . . . . That is, the third bonding pads 35c . . . are disposed so as to be surrounded by the first bonding pads 35a, and the second bonding pads 35b are disposed so as to be surrounded by the third bonding pads 35c . . . .

The interposer chip 31 includes the third bonding pads 35c . . . as described above, so that it is possible to make the same interposer chip 31 correspond to semiconductor chips different from each other in terms of the size as shown in FIG. 7 and FIG. 8. This is described as follows.

FIG. 7 is a plan view obtained by viewing, from above in a stacking direction, the semiconductor device of the present embodiment in which a semiconductor chip 1 is stacked on the interposer chip 31 of FIG. 6, and FIG. 8 is a plan view obtained by viewing, from above in a stacking direction, the semiconductor device of the present invention in which another semiconductor chip 1 different from the foregoing semiconductor chip 1 in terms of the size is stacked on the interposer chip of FIG. 6.

As shown in FIG. 7, the semiconductor chip 1 whose size allows the second bonding pads 35b to surround the semiconductor chip 1 is stacked on the interposer chip 31 of FIG. 6. The bonding pads 15 . . . of the semiconductor chip 1 and the second bonding pads 35b . . . on the interposer chip 31 are wire-bonded, and they are electrically connected to each other via the wires 8 . . . .

Further, as shown in FIG. 8, the semiconductor chip 1 whose size does not allow the second bonding pads 35b to surround the semiconductor chip 1 but allows the third bonding pads 35c . . . to surround the semiconductor chip 1 is stacked on the interposer chip 31 of FIG. 6. The bonding pads 15 . . . of the semiconductor chip 1 and the third bonding pads 35c . . . are wire-bonded so as to be electrically connected to each other via the wires 8 . . . .

In this manner, the interposer chip 31 shown in FIG. 6 allows the different-sized semiconductor chips 1 to be stacked thereon.

In case where only the first and second bonding pads are formed as the bonding pads on the interposer chip, only the semiconductor chip whose size allows the second bonding pads to surround the semiconductor chip can be stacked on the interposer chip. Here, when the second bonding pads are disposed more outward, it is possible to cover a larger semiconductor chip. However, when the semiconductor chip whose size is much smaller than an area surrounded by the second bonding pads is stacked, a length of a wire which connects the second bonding pad to the bonding pad on the semiconductor chip is too long.

On the other hand, according to the arrangement of the present embodiment, it is possible to switch the bonding pads provided on the interposer chip which are wire-bonded to the bonding pads on the semiconductor chip so as to correspond to the sizes of the semiconductor chip. Thus, even when the size of the stacked semiconductor chip varies, it is possible to make electric connection so that the length of the wire for connecting the second bonding pad to the bonding pad on the semiconductor chip is not too long.

Further, it may be so arranged that: fourth or further bonding pads are disposed between lines of the foregoing bonding pads, and the bonding pads are respectively connected to each other by the wirings 7. In this manner, by increasing the number of the bonding pads, the size of the semiconductor chip stacked on the interposer chip 31 less restricts the arrangement.

Further, as in Embodiment 4, also in the present embodiment, it is possible to dispose the wirings 7 . . . between first bonding pads 35a . . . and the third bonding pads 35c . . . , and/or between the second bonding pads 35b . . . and the third bonding pads 35c so that the wirings 7 . . . do not cross each other. Even when the size of the semiconductor chip 1 varies, it is possible to electrically connect the bonding pads 15 . . . of the semiconductor chip 1 to the boding terminals 6 . . . on the substrate 4 so that each of bonding terminals 6 . . . does not correspond to the nearest bonding pad 15. Thus, it is possible to manufacture the interposer chip which allows different types, of the semiconductor chips to be stacked thereon.

In addition to the foregoing arrangement, the semiconductor device according to the present invention may be arranged so that: the interposer chip is formed by using a wafer made of the same material and having the same structure as a wafer used in forming the foregoing semiconductor chip.

According to the arrangement, the interposer chip is formed by using a wafer made of the same material and having the same structure as a wafer used in forming the semiconductor chip, so that it is possible to form wirings with a fine wiring pitch so as to relay a wire-bonding wire. That is, as to the semiconductor chip, in case of forming a wiring layer on the wafer, it is possible to set the minimum wiring pitch to be not more than 1 μm. Thus, also in the interposer chip, it is possible to form connection wirings whose wiring pitch is so fine that its minimum value is 1 μm likewise.

Further, it is possible to form the interposer chip by using the same wafer as the wafer used in forming the semiconductor chip, so that it is not necessary to prepare another substrate for the interposer chip. Thus, it is possible to reduce the manufacturing cost and the device cost.

The arrangements described in the foregoing Embodiments are applicable even when the number of stacked semiconductor chips increases.

As described above, the semiconductor device according to the present invention, in which one or more semiconductor chips each having an externally leading electrode are stacked on a stacking base, includes an interposer chip on which one or more connection wirings are formed, wherein: the externally leading electrode provided on at least one of the semiconductor chips is connected to the connection wiring of the interposer chip by wire bonding, and the external leading electrode, connected to the connection wiring, which is provided on the semiconductor chip, relays the connection wiring so as to be electrically connected to an electrode of a wiring provided on the stacking base or another of the semiconductor chips.

Further, the semiconductor device according to the present invention is arranged so that the interposer chip is formed by using the same device as a device for forming the semiconductor chip.

According to the arrangement, the interposer chip is formed by using the same device as a device for forming the semiconductor chip. Thus, in the step of forming the connection wirings of the interposer chip, it is possible to form connection wirings whose wiring pitch is fine as in the case of forming the wiring layer on the wafer in forming the semiconductor chip. Further, as to a device for forming the interposer chip, it is possible to use the same device as a device for forming the semiconductor chip, so that it is possible to reduce the manufacturing cost.

Further, in addition to the foregoing arrangement, the semiconductor device according to the present invention may be arranged so that at least one of the semiconductor chips is stacked at a position upper than the interposer chip in a stacking direction.

According to the arrangement, the semiconductor chip is wire-bonded via the interposer chip, so that it is possible to electrically connect the electrode of the semiconductor chip provided at a position upper than the interposer chip in the stacking direction to the electrode provided at a position lower than the interposer chip in the stacking direction.

Further, in addition to the foregoing arrangement, the semiconductor device according to the present invention may be arranged so that said one or more connection wirings provided on the interposer chip include: one or more first bonding pads electrically connected to external electrodes, provided at a position lower than the interposer chip in the stacking direction, by wire bonding; and one or more second bonding pads electrically connected to electrodes, provided at a position upper than the interposer chip in the stacking direction, by wire bonding.

According to the arrangement, the bonding pads are provided on the connection wirings of the interposer chip, so that it is possible to use the bonding pads as wire bonding pads and electrode pads that are used in making external connection. Thus, it is possible to electrically connect the interposer chip to the external electrodes. When the wire bonding is performed via the interposer chip pads, it is possible to make each wire shorter than that in the case of directly wire-bonding the semiconductor chip positioned at an upper stage to the stacking base.

Thus, it is possible to shorten the wire provided on a semiconductor chip, which would cause the wire to be extremely long when connected to the stacking base, by performing single wire bonding.

Further, according to the arrangement, the first bonding pads can be connected to the external electrodes provided at a position lower than the interposer chip in the stacking direction by wire bonding, and the second bonding pads can be connected to the external electrodes provided at a position upper than the interposer chip in the stacking direction by wire bonding. Further, the first bonding pads and the second bonding pads are connected to each other by the connection wirings.

Thus, the electrodes of the semiconductor chip provided at a position upper than the interposer chip can be electrically connected to the electrodes of the stacking base or another semiconductor chip via two lines of the bonding pads of the interposer chip.

Further, in addition to the foregoing arrangement, the semiconductor device according to the present invention may be arranged so that the interposer chip and the semiconductor chip are stacked on the stacking base or another of the semiconductor chips so as to be disposed side by side.

According to the arrangement, out of the externally leading electrodes provided on the semiconductor chip, electrodes provided further away from electrodes provided on the stacking base or another semiconductor chip can be electrically connected via the interposer chip provided with the semiconductor chip side by side.

Here, it may be so arranged that the interposer chip is stacked on the stacking base or another semiconductor chip, and a semiconductor chip is stacked thereon, but this arrangement causes the semiconductor device to be thicker. On the other hand, according to the aforementioned arrangement, the interposer chip is disposed with the semiconductor chip side by side, so that it is possible to suppress the increase in the thickness of the semiconductor device. That is, it is possible to effectively utilize an area of the semiconductor chip or an area of the stacking base, which are provided at a position lower than the interposer chip in the stacking direction, in stacking the chips.

Further, in addition to the foregoing arrangement, the semiconductor device according to the present invention may be arranged so that said one or more connection wirings provided on the interposer chip include: one or more first bonding pads electrically connected to external electrodes, provided at a position lower than the interposer chip in the stacking direction, by wire bonding; and one or more second bonding pads electrically connected to electrodes, provided at a position upper than the interposer chip in the stacking direction, by wire bonding.

According to the arrangement, the interposer chip and the semiconductor chip are disposed on the stacking base or another semiconductor chip so as to be positioned side by side, and the first bonding pads are wire-bonded to the external electrodes provided at a position lower than the interposer chip in the stacking direction, and the second bonding pads are wire-bonded to the electrodes of the semiconductor chip provided with the interposer chip side by side.

Thus, the electrodes of the semiconductor chip provided at a position upper than the interposer chip in the stacking direction can be electrically connected to the electrodes of the stacking base or another semiconductor chip via two lines of bonding pads of the interposer chip by wire bonding without increasing the thickness of thus stacked chips of the semiconductor device even when the interposer chip is stacked.

Further, in addition to the foregoing arrangement, the semiconductor device according to the present invention may be arranged so that: the number of the connection wirings provided on the interposer chip is plural, and the connection wirings are disposed so as not to cross each other.

According to the arrangement, a plurality of connection wirings are provided on the interposer chip, so that a plurality of electrodes of the semiconductor chip can be electrically connected to a plurality of electrodes of the stacking base or another semiconductor chip via the connection wirings.

Further, the respective connection wirings are disposed so as not to cross each other, so that it is possible to prevent disadvantages such as short circuit. As a result, it is possible to make the electrical connection without fail.

Further, in addition to the foregoing arrangement, the semiconductor device of the present invention may be arranged so that an order in which the first bonding pads are disposed is different from an order in which the second bonding pads connected to the first bonding pads by the connection wirings.

According to the arrangement, the first bonding pads and the second bonding pads corresponding thereto are different from each other in terms of an order, so that an order in which the external electrodes connected to the first bonding pads are disposed may be different from an order in which the external electrodes connected to the second bonding pads. Thus, the electrodes of the semiconductor chip provided at a position upper than the interposer chip in the stacking direction can be electrically connected to any electrode of the stacking base or another semiconductor chip that is provided at a position lower than the interposer chip. Thus, it is not necessary to design the wirings of the stacking base so as to correspond to the respective semiconductor chips, so that it is possible to more easily design and manufacture the stacking base.

Further, in addition to the foregoing arrangement, the semiconductor device according to the present invention may be arranged so that: one or more additional bonding pads are provided on the connection wiring of the interposer chip so as to be positioned between the first bonding pad and the second bonding pad, and two arbitrary bonding pads out of the first bonding pad, the second bonding pad, and the additional bonding pad are connected to external electrodes by wire bonding.

According to the arrangement, the first bonding pads and additional bonding pads are connected to each other by the wirings, and the additional bonding pads and the second bonding pads are connected to each other by the wirings. Further, arbitrary two lines out of the lines of the first, second, and additional bonding pads are used to make connection with the external electrodes.

Thus, in case where a semiconductor chip having a certain size is provided on the interposer chip, it is possible to connect the second bonding pads to electrodes of the semiconductor chip, and it is possible to connect the first bonding pads to electrodes positioned at a lower stage. Further, in case where a semiconductor chip having another size is provided on the interposer chip, it is possible to connect other bonding pads to electrodes of the semiconductor chip, and it is possible to connect the first bonding pads to the electrodes positioned at a lower stage. That is, it is possible to provide the semiconductor chips different from each other in its size on the same interposer chip having the first, second, and additional bonding pads.

In this manner, the arrangement of the interposer chip is less influenced by the semiconductor chip, so that it is possible to prevent the yield of the wire bonding step from dropping, thereby allowing stackable semiconductor chips to be more freely combined with each other.

Further, in addition to the foregoing arrangement, the semiconductor device according to the present invention may be arranged so that: the number of the connection wirings provided on the interposer chip which has the first, second, and additional bonding pads is plural, and the connection wirings are disposed so as not to cross each other.

According to the arrangement, the plurality of connection wirings are provided, so that a plurality of electrodes of the semiconductor chip can be electrically connected to a plurality of electrodes of the stacking base or another semiconductor chip via the connection wirings even when the interposer chip having the first, second, and additional bonding pads is used.

Further, the connection wirings are disposed so as not to cross each other, so that it is possible to make the electric connection without fail.

Further, in addition to the foregoing arrangement, the semiconductor device according to the present invention may be arranged so that at least two orders out of (i) an order in which the first bonding pads are disposed, (ii) an order in which the second bonding pads connected to the first bonding pads by the connection wirings are disposed, and (iii) an order in which the additional bonding pads connected to the second bonding pads by the connection wirings are disposed, are different from each other.

According to the arrangement, at least two orders out of (i) the order in which the first bonding pads are disposed, (ii) the order in which the second bonding pads are disposed, and (iii) the order in which the additional bonding pads are disposed, are different from each other, so that at least two orders out of (a) an order in which external electrodes connected to the first bonding pads are disposed, (b) an order in which external electrodes connected to the second bonding pads are disposed, and (c) an order in which external electrodes connected to the additional bonding pads are disposed, may be different from each other.

Thus, also in case where a plurality of semiconductor chips having bonding-pad-disposition orders different from each other are provided on the interposer chip, electrodes of the semiconductor chip provided at a position upper than the interposer chip in a stacking direction can be electrically connected to any electrodes of the stacking base or another semiconductor chip provided at a position lower than the interposer chip.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, in which one or more semiconductor chips each having an externally leading electrode are stacked on a stacking base, comprising an interposer chip on which one or more connection wirings are formed, at least one pair of bonding pads provided on the interposer chip and connected by the connection wiring(s), wherein:

the externally leading electrode provided on at least one of the semiconductor chips is electrically connected to a first bonding pad of the at least one pair of bonding pads, a second bonding pad of the at least one pair of bonding pads is electrically connected to an electrode provided on the stacking base or on another of the semiconductor chips, and the first bonding pad is provided on the interposer chip closer to the externally leading electrode than the second bonding pad.

2. The semiconductor device as set forth in claim 1, wherein the interposer chip is formed by using a wafer made of the same material and having the same structure as a wafer used in forming the semiconductor chip.

3. The semiconductor device as set forth in claim 1, wherein the interposer chip is formed by using the same device as a device for forming the semiconductor chip.

4. The semiconductor device as set forth in claim 1, wherein the semiconductor chip is covered by a surface protection film so that the externally leading electrode is uncovered.

5. The semiconductor device as set forth in claim 1, wherein at least one of the semiconductor chips is stacked at a position upper than the interposer chip in a stacking direction.

6. The semiconductor device as set forth in claim 1, wherein the interposer chip has no functional elements formed thereon.

7. A semiconductor device, in which one or more semiconductor chips each having an externally leading electrode are stacked on a stacking base, comprising:

an interposer chip on which one or more connection wirings are formed, wherein:

the externally leading electrode provided on at least one of the semiconductor chips is connected to the connection wiring of the interposer chip by wire bonding, the external leading electrode, connected to the connection wiring, which is provided on the semiconductor chip, [relays the connection wiring so as to be] *is* electrically connected *by the connection wiring* to an electrode of a wiring provided on the stacking base and/or another of the semiconductor chips; [and]

wherein at least one of the semiconductor chips is stacked at a position upper than the interposer chip in a stacking direction*; and*

*wherein said one or more connection wirings provided on the interposer chip include:*

*one or more first bonding pads electrically connected to external electrodes, provided at a position lower than the interposer chip in the stacking direction, by wire bonding;*

*one or more second bonding pads electrically connected to electrodes, provided at a position upper than the interposer chip in the stacking direction, by wire bonding;*

*the number of the connection wirings provided on the interposer chip is plural; and*

*the connection wirings are disposed so as not to cross each other.*

[8. The semiconductor device as set forth in claim 7, wherein said one or more connection wirings provided on the interposer chip include:

one or more first bonding pads electrically connected to external electrodes, provided at a position lower than the interposer chip in the stacking direction, by wire bonding; and one or more second bonding pads electrically connected to electrodes, provided at a position upper than the interposer chip in the stacking direction, by wire bonding.]

9. A semiconductor device, in which one or more semiconductor chips each having an externally leading electrode are stacked on a stacking base, comprising an interposer chip on which one or more connection wirings are formed, wherein:

the externally leading electrode provided on at least one of the semiconductor chips is connected to the connection wiring of the interposer chip by wire bonding, the external leading electrode, connected to the connection wiring, which is provided on the semiconductor chip, relays the connection wiring so as to be electrically connected to an electrode of a wiring provided on the stacking base and/or another of the semiconductor chips; and wherein the interposer chip and the semiconductor chip are stacked on the stacking base or another of the semiconductor chips (2) so as to be disposed side by side.

10. The semiconductor device as set forth in claim 9, wherein said one or more connection wirings provided on the interposer chip include:

one or more first bonding pads electrically connected to external electrodes, provided at a position lower than the interposer chip in the stacking direction, by wire bonding; and one or more second bonding pads electrically connected to electrodes, provided at a position upper than the interposer chip in the stacking direction, by wire bonding.

[11. The semiconductor device as set forth in claim 8, wherein:

the number of the connection wirings provided on the interposer chip is plural, and the connection wirings are disposed so as not to cross each other.]

12. The semiconductor device as set forth in claim 10, wherein:

the number of the connection wirings provided on the interposer chip is plural, and the connection wirings are disposed so as not to cross each other.

13. The semiconductor device as set forth in claim [11] *7*, wherein an order in which the first bonding pads are disposed is different from an order in which the second bonding pads connected to the first bonding pads by the connection wirings.

14. The semiconductor device as set forth in claim 12, wherein an order in which the first bonding pads are disposed is different from an order in which the second bonding pads connected to the first bonding pads by the connection wirings.

[15. The semiconductor device as set forth in claim 8, wherein the number of the connection wirings provided on the interposer chip is plural, and the connection wirings are disposed in a roundabout manner.]

16. The semiconductor device as set forth in claim 10, wherein the number of the connection wirings provided on the interposer chip is plural, and the connection wirings are disposed in a roundabout manner.

[17. The semiconductor device as set forth in claim 8, wherein:

one or more additional bonding pads are provided on the connection wiring of the interposer chip so as to be positioned between the first bonding pad and the second bonding pad, and two arbitrary bonding pads out of the first bonding pad, the second bonding pad, and the additional bonding pad are connected to external electrodes by wire bonding.]

18. The semiconductor device as set forth in claim 10, wherein:

one or more additional bonding pads are provided on the connection wiring of the interposer chip so as to be positioned between the first bonding pad and the second bonding pad, and two arbitrary bonding pads out of the first bonding pad, the second bonding pad, and the additional bonding pad are connected to external electrodes by wire bonding.

19. The semiconductor device as set forth in claim [17] *30*, wherein:

the number of the connection wirings provided on the interposer chip is plural, and the connection wirings are disposed so as not to cross each other.

20. The semiconductor device as set forth in claim 18, wherein: the number of the connection wirings provided on the interposer chip is plural, and the connection wirings are disposed so as not to cross each other.

21. The semiconductor device as set forth in claim 19, wherein at least two orders out of (i) an order in which the first bonding pads are disposed, (ii) an order in which the second bonding pads connected to the first bonding pads by the connection wirings are disposed, and (iii) an order in which the additional bonding pads connected to the second bonding pads by the connection wirings are disposed, are different from each other.

22. The semiconductor device as set forth in claim 20, wherein at least two orders out of (i) an order in which the first bonding pads are disposed, (ii) an order in which the second bonding pads connected to the first bonding pads by the connection wirings are disposed, and (iii) an order in which the additional bonding pads connected to the second bonding pads by the connection wirings are disposed, are different from each other.

*23. A semiconductor device, in which one or more semiconductor chips each having an externally leading electrode are stacked on a stacking base, comprising:*

*an interposer chip on which a plurality of connection wirings are formed, wherein:*

*the externally leading electrode provided on at least one of the semiconductor chips is connected to at least one of the connection wirings of the interposer chip,*

*the external leading electrode, connected to the connection wiring, which is provided on the semiconductor chip, is electrically connected by the connection wiring to an electrode of a wiring provided on the stacking base or another of the semiconductor chips,*

*said plurality of connection wirings include (i) first bonding pads electrically connected to the electrode of the wiring provided on the stacking base or said another of the semiconductor chips, and (ii) second bonding pads electrically connected to the external leading electrode provided in the semiconductor chip,*

*an order in which the first bonding pads are disposed is different from an order in which the second bonding pads connected to the first bonding pads by the connection wirings are disposed, and*

*at least one of the semiconductor chips is stacked at a position upper than the interposer chip in a stacking direction.*

*24. A semiconductor device, in which one or more semiconductor chips each having an externally leading electrode are stacked on a stacking base, comprising:*

*an interposer chip on which a plurality of connection wirings are formed, wherein:*

*the externally leading electrode provided on at least one of the semiconductor chips is connected to at least one of the connection wirings of the interposer chip,*

*the external leading electrode, connected to the connection wiring, which is provided on the semiconductor chip, is electrically connected by the connection wiring to an electrode of a wiring provided on the stacking base or another of the semiconductor chips,*

*the connection wirings are disposed in a roundabout manner, and*

*at least one of the semiconductor chips is stacked at a position upper than the interposer chip in a stacking direction.*

*25. A semiconductor device, in which one or more semiconductor chips each having an externally leading electrode are stacked on a stacking base, comprising:*

*an interposer chip on which a plurality of connection wirings are formed; and*

*at least one pair of bonding pads are provided on the interposer chip and connected by the connection wirings,*

*wherein:*

*the externally leading electrode provided on at least one of the semiconductor chips is electrically connected to a first bonding pad of the at least one pair of bonding pads,*

*a second bonding pad of the at least one pair of bonding pads is electrically connected to an electrode provided on the stacking base or on another of the semiconductor chips,*

*the first bonding pad is provided on the interposer chip closer to the externally leading electrode than the second bonding pad, and*

*in a case where said at least one pair of bonding pads includes two or more pairs of bonding pads, an order in which first bonding pads of said two or more pairs of bonding pads are disposed is different from an order in which second bonding pads of said two or more pairs of bonding pads are disposed, the second bonding pads being connected to the first bonding pads by the connection wirings.*

*26. A semiconductor device, in which one or more semiconductor chips each having an externally leading electrode are stacked on a stacking base, comprising:*

*an interposer chip on which a plurality of connection wirings are formed; and*

*at least one pair of bonding pads provided on the interposer chip and connected by the connection wirings, wherein:*

*the externally leading electrode provided on at least one of the semiconductor chips is electrically connected to a first bonding pad of the at least one pair of bonding pads,*

*a second bonding pad of the at least one pair of bonding pads is electrically connected to an electrode provided on the stacking base or on another of the semiconductor chips,*

*the first bonding pad is provided on the interposer chip closer to the externally leading electrode than the second bonding pads, and*

*the connection wirings are disposed in a roundabout manner.*

*27. A semiconductor device, in which one or more semiconductor chips, each having an externally leading electrode, are stacked on a stacking base, comprising:*

*an interposer ship on which a plurality of connection wirings are formed, wherein:*

*the externally leading electrode provided on at least one of the semiconductor chips is connected to at least one of the connection wirings of the interposer chip,*

*the external leading electrode, connected to the connection wiring, which is provide on the semiconductor chip, is electrically connected by the connection wiring to an electrode of a wiring provided on the stacking base or another of the semiconductor chips,*

*said plurality of connection wirings include (i) first bonding pads electrically connected to the electrode of the wiring provided on the stacking base or said another of the semiconductor chips, and (ii) second bonding pads electrically connected to the external leading electrode provided in the first semiconductor chip,*

*an order in which the first bonding pads are disposed is different from an order in which the second bonding pads connected to the first bonding pads by the connection wirings are disposed, and*

*the interposer chip and the semiconductor chip are stacked on the stacking base or another of the semiconductor chips so as to be disposed side by side.*

*28. A semiconductor device in which one or more semiconductor chips, each having an externally leading electrode, are stacked on a stacking base, comprising:*

*an interposer chip on which a plurality of connection wirings are formed, wherein:*

*the externally leading electrode provided on at least one of the semiconductor chips is connected to at least one of the connection wirings of the interposer chip,*

*the external leading electrode, connected to the connection wiring, which is provided on the semiconductor chip, is electrically connected by the connection wiring to an electrode of a wiring provided on the stacking base or another of the semiconductor chips,*

*the connection wirings are disposed in a roundabout manner, and*

*the interposer chip and the semiconductor chip are stacked on the stacking base or another of the semiconductor chips so as to be disposed side by side.*

*29. A semiconductor device, in which one or more semiconductor chips each having an externally leading electrode are stacked on a stacking base, comprising:*

*an interposer chip on which one or more connection wirings are formed, wherein:*

*the externally leading electrode provided on at least one of the semiconductor chips is connected to the connection wiring of the interposer chip by wire bonding,*

*the external leading electrode, connected to the connection wiring, which is provided on the semiconductor chip, is electrically connected by the connection wiring to an electrode of a wiring provided on the stacking base and/or another of the semiconductor chips;*

*wherein at least one of the semiconductor chips is stacked at a position upper than the interposer chip in a stacking direction; and*

*wherein said one or more connection wirings provided on the interposer chip include:*

*one or more first bonding pads electrically connected to external electrodes, provided at a position lower than the interposer chip in the stacking direction, by wire bonding;*

*one or more second bonding pads electrically connected to electrodes, provided at a position upper than the interposer chip in the stacking direction, by wire bonding;*

*the number of the connection wirings provided on the interposer chip is plural; and*

*the connection wirings are disposed in a roundabout manner.*

*30. A semiconductor device, in which one or more semiconductor chips each having an externally leading electrode are stacked on a stacking base, comprising:*

*an interposer chip on which one or more connection wirings are formed, wherein:*

*the externally leading electrode provided on at least one of the semiconductor chips is connected to the connection wiring of the interposer chip by wire bonding,*

*the external leading electrode, connected to the connection wiring, which is provided on the semiconductor*

*chip, is electrically connected by the connection wiring to an electrode of a wiring provided on the stacking base and/or another of the semiconductor chips;*

*wherein at least one of the semiconductor chips is stacked at a position upper than the interposer chip in a stacking direction; and*

*wherein said one or more connection wirings provided on the interposer chip include:*

*one or more first bonding pads electrically connected to external electrodes, provided at a position lower than the interposer chip in the stacking direction, by wire bonding;*

*one or more second bonding pads electrically connected to electrodes, provided at a position upper than the interposer chip in the stacking direction, by wire bonding;*

*one or more additional bonding pads are provided on the connection wiring of the interposer chip so as to be positioned between the first bonding pad and the second bonding pad; and*

*two arbitrary bonding pads out of the first bonding pad, the second bonding pad, and the additional bonding pad are connected to external electrodes by wire bonding.*

* * * * *